United States Patent [19]

Honda

[11] 4,112,396
[45] Sep. 5, 1978

[54] ECHO ANNEXATION DEVICE

[76] Inventor: Chuzo Honda, 2-45, Shiroki-cho, Chikusa-ku, Nagoya-shi, Aichi-ken, Japan, 464

[21] Appl. No.: 654,715

[22] Filed: Feb. 2, 1976

[30] Foreign Application Priority Data

Feb. 17, 1975 [JP] Japan .................................. 50-20204
May 19, 1975 [JP] Japan .................................. 50-59415
Jun. 13, 1975 [JP] Japan .................................. 50-72304

[51] Int. Cl.$^2$ .................... H03H 9/30; G10H 1/02; H03H 9/26
[52] U.S. Cl. .................... 333/30 R; 84/1.25; 84/DIG. 26; 179/1 J; 333/71
[58] Field of Search ............ 333/30 R, 30 M, 71, 333/29; 84/1.1, 1.04, 1.06, 1.14, 1.15, 1.2, 1.25, DIG. 26; 179/1 J; 310/26, 36

[56] References Cited

U.S. PATENT DOCUMENTS

| 3,092,792 | 6/1963 | Daniel ............................. 333/30 R |
| 3,106,610 | 10/1963 | Young ............................. 333/30 R X |
| 3,136,853 | 6/1964 | Bissonette et al. ............ 179/1 J |
| 3,199,053 | 8/1965 | Bunger ............................ 333/31 X |
| 3,288,931 | 11/1966 | Bunger ............................ 333/30 R X |
| 3,333,061 | 7/1967 | Dow ............................... 179/1 J |
| 3,363,202 | 1/1968 | Meinema .......................... 333/30 R |
| 3,402,371 | 9/1968 | Weingartner et al. ........... 333/30 R |
| 3,517,344 | 6/1970 | Fidi ................................ 333/30 R |
| 3,564,462 | 2/1971 | Fidi et al. ....................... 333/30 R X |
| 3,649,933 | 3/1972 | Fidi et al. ....................... 333/30 R |

*Primary Examiner*—Alfred E. Smith
*Assistant Examiner*—Marvin Nussbaum
*Attorney, Agent, or Firm*—Wenderoth, Lind & Ponack

[57] ABSTRACT

The present invention is related to devices for annexing an echo resembling natural reverberation in the course of sound recording, in which a line or lines of coil spring with a portion or portions protruded axially at a right angle are spanned between the drive-transducer and the pickup-transducer.

10 Claims, 16 Drawing Figures

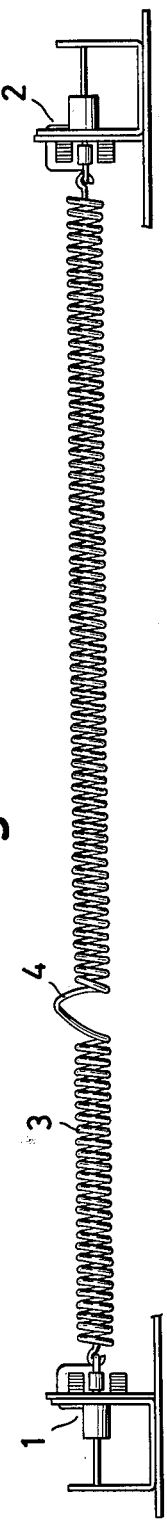
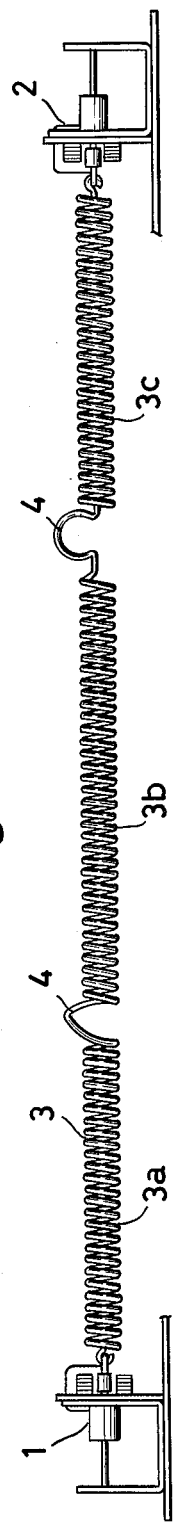
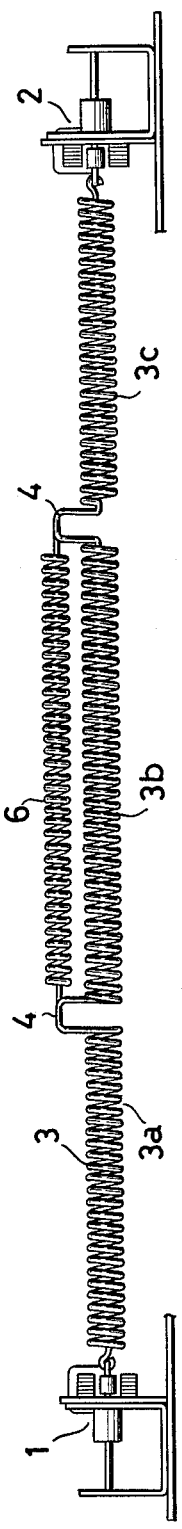

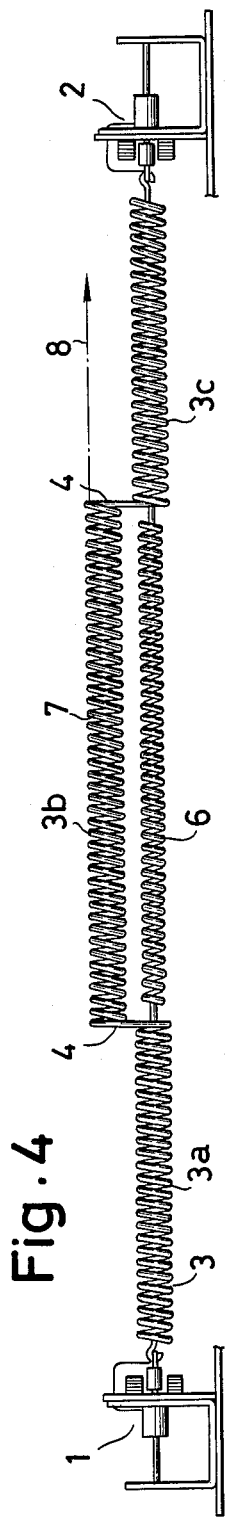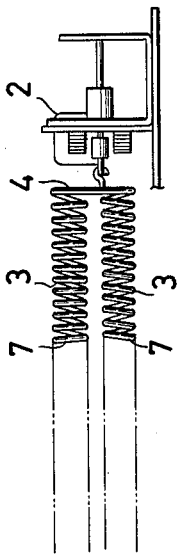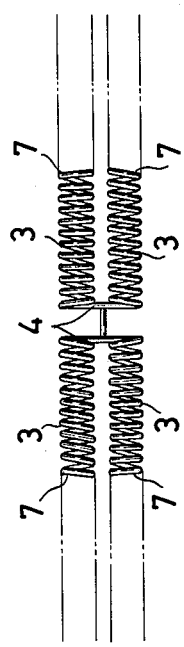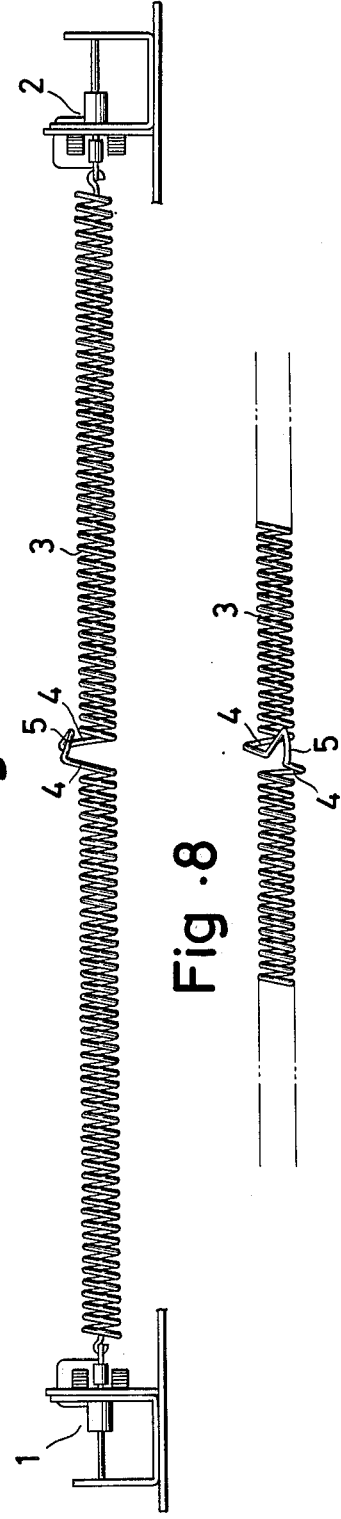

4,112,396

ECHO ANNEXATION DEVICE

BACKGROUND OF THE INVENTION

The present invention falls into the field of echo annexation devices which use coil springs as materials for a signal retardation device.

Generally, in the echo annexation device, the mechanical vibration impressed on a coil spring by the drive-transducer is helically transmitted along the coil spring, namely, along the helical direction, and concurrently the vibration causes the retardation in time at both ends of the coil spring by repeating intermittently the reflection. Consequently, the retardation said in time generates the echo.

The intermittently repeating reflex movement induces the inherent compressive movement of the coil spring and results in casing the stationary wave, which modulates the echo vibration modulated, and causes flutter sound on the part of the pickup-transducer. Therein the frequency characteristics are marred so much that distortion develops.

To prevent this distortion, various devices have been presented. So far, some devices have two kinds of coil springs different in helical direction, and other devices have a portion having a different coil pitch on the coil spring, but none of them has succeeded in preventing this distortion.

SUMMARY OF THE INVENTION

The primary object of the provide an invention is to present echo annexation device which functions to completely prevent flutter modulation by having the reflection movement which is generated axially at both ends suppressed with a suppressive movement of the coil spring which is spanned between the drive-transducer and the pickup-transducer by having a portion of the coil spring protrude axially at approximately a right angle to the spring.

The second object of the present invention is to provide an echo annexation device which can handle the of complex frequency made of different retardation in time by having two portions of the coil spring between the drive-transducer and the pickup-transducer providing axially at a right angle to the spring., and further by providing a coil spring between the two protrusions as of a by-pass.

The third object of the present invention is to have a remnant time in each frequency band of low, medium, and high pitched sound made uniform by having a portion of the coil spring between the drive-transducer and the pickup-transducer protrude erected axially at approximately a right angle as well as having the tip of the said protrusion bent in an optional direction or looped several times. Also, the portion is made to function as a reflecting point for helically transmitting the vibration for the purpose of obtaining an echo. Herewith an echo annexation device is also presented which is also capable, with use of only one line of coil spring, of the same excellent echo effect achieved when plural lines of coil spring are used.

Other objects and advantages of the invention will become apparent during the following discussion of the accompanying drawings wherein:

DESCRIPTION OF THE DRAWINGS

FIG. 1 is the front view of the first embodiment of the present invention.

FIG. 2 is the front view of the second embodiment of the present invention.

FIG. 3 is the front view of the third embodiment of the present invention.

FIG. 4 is the front view of the fourth embodiment of of the present invention.

FIG. 5 is the front view of the fifth embodiment of the present invention.

FIG. 6 is the front view of the sixth embodiment of the present invention, showing only the essential part.

FIG. 7 is the front view of the seventh embodiment of the present invention.

FIG. 8 is the plan view of the seventh embodiment, showing only the essential part.

DESCRIPTION OF THE EMBODIMENT

Figure 9:
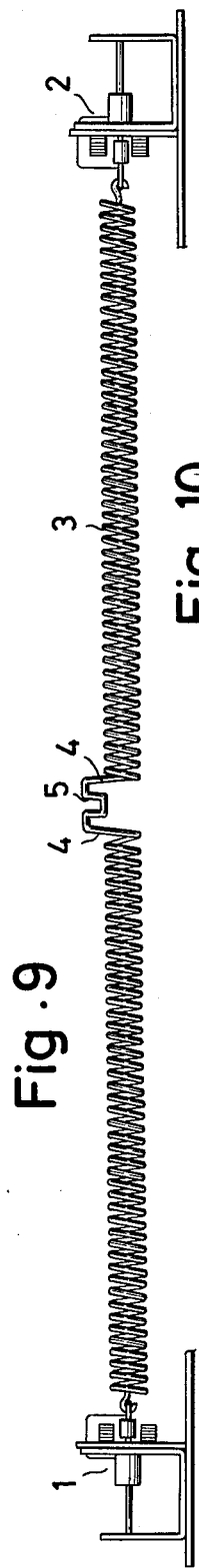
FIG. 9 is the front view of the eighth embodiment.

The detailed description of the present invention is given according to the figures annexed.

In FIG. 1, 1 is the drive-transducer, 2 is the pickup-transducer, 3 is the coil spring spanned between both 1 and 2 transducers, 4 is a portion midway of the said coil spring 3, and protrudes from the spring 3. Said protrusion 4 is longer than the normal diameter of the coil of the coil spring and protrudes axially at approximately a right angle. Also, the protrusion 4 is uniformly shaped approximately in the form of an arch so that the helical direction of the coil spring 3 is in series.

FIG. 2 shows two protrusions 4 4, that is, a first protrusion 4 protruding in approximately an arched form as mentioned above, so that the helical direction of the coil spring 3 is in series. Concurrently at the right side position of the same figure, the helical direction is not in series as mentioned above, and the second protrusion 4 is approximately in the form of letter Omega $\Omega$ and is axially straight when viewed from above.

As mentioned above, one or plural protrusions 4 at any portion of the coil spring 3 spanned between the drive-transducer and the pickup-transducer can completely suppress the axially directed reflection generated with the suppressing movement induced by the repeating reflection at both ends of the coil spring 3.

Consequently, the flutter modulation is completely prevented. This means that the protrusions 4 4 protruding axially at approximately right angles at any portion of the the coil spring result in increasing the elastic flexibility in proportion to the protruding length of the portions. This makes it possible to expect more elastic flexibility than is available with other helical portions of the coil spring 3. Thus, the suppressing movement induced by the repetition of vibration transmission in the helical direction to obtain an echo effect can be completely absorbed by the elastic flexibility at the protrusion 4, and the elastic flexibility makes it possible to completely suppress the flutter modulation.

FIG. 3 shows two protrusions 4 4 on the coil spring 3 as shown in the embodiment of FIG. 2, and also shows a bypass 6 between the said protrusions 4 4. In FIG. 3, at the left side of the coil spring 3, the first protrusion 4 protruding axially at approximately right angle is formed in a stanchion shape ⊓ and is helically in series. At the right side of the coil spring 3, a second protrusion 4 protruded axially approximately coaxially with the coil spring when viewed from above, without being helically in series. Finally, and a by-pass 6 of coil spring 6, which is dissimilar in helical diameter and material to the base coil spring 3 is spanned between the two tips of of the protrusions 4 4.

Figure 13:
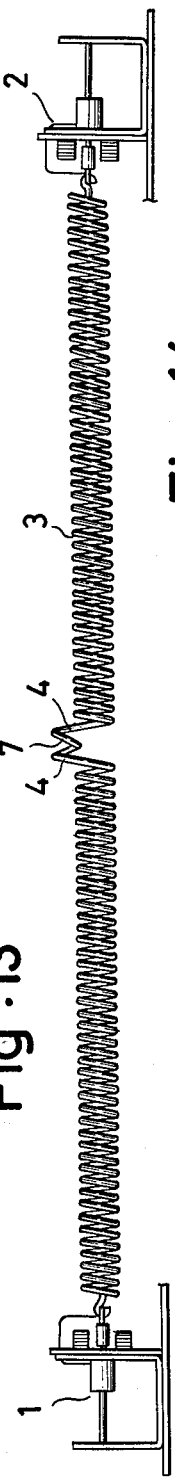
FIG. 13 is the front view of the tenth embodiment.
Figure 14:
FIG. 14 is the front view of the tenth embodiment, showing only the essential part.
Figure 15:
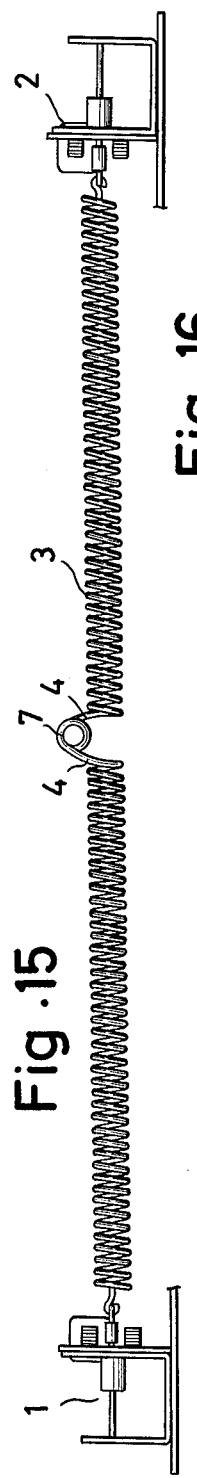
FIG. 15 is the front view of the eleventh embodiment.
Figure 16:
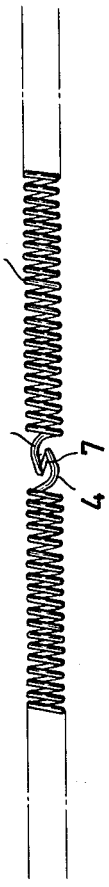
FIG. 16 is the front view of the eleventh embodiment, showing only the essential part.

In FIG. 4 a by-pass is shown similar to that shown in the embodiment made from the embodiment shown in both FIG. 13 and FIG. 14 as shown below. In the embodiments of FIG. 13 and FIG. 14 a special portion 7 is looped once on the tip of the protrusion 4; however in FIG. 4, several looped portions 7 are connected in series. Furthermore, a coil spring 6 is spanned between both ends of the protrusion 4 and this spring 6 has a helical diameter and material property different than coil spring 3 and the special portion 7. Also, a line of thread 8 is provided fixing the protrusion 4. Thus, a device which has a protrusion 4 fixed at two positions on the coil spring 3 and has a coil spring 6 is spanned as the by-pass between the ends of the protrusion 4, as shown in FIG. 3 and FIG. 4, can completely suppress, at at protrusion 4, the reflection axially generated by the compressive movement induced by repeating reflections at both ends of the coil spring 3. Flutter modulation can thus be naturally prevented, and in addition to these functions, complex reflection routes in which retardation time is different are be obtained in this embodiment. The device make it possible to evade the resonance point.

FIG. 5 shows an applied example of the embodiment shown in the above mentioned FIG. 4. As shown in FIG. 4, the protrusion 4 provided with the special looped portion 7 is made by having many numbers of succeeding loops. In FIG. 5, these loops are presented in parallel, above and below, and a pair of such looped structures is provided in succession.

In FIG. 6, the protrusion 4 having the special looped protion 7 is made by having many numbers of loops as mentioned above and there are again two series of parallel loops, is drawn by two in parallel above and below. One end of the protrusion 4 is directly connected to the pickup-transducer 2. With such a structure, a flutter modulation can be attained as effective as that mentioned in the above, and also, a complex route of reflection can be obtained.

In both FIG. 7 and FIG. 8 the protrusion 4 is formed in an arch shape in the midway portion of the coil spring 3 spanned between the drive-transducer and the pickup-transducer 2. The diameter at the arch is larger than that of the coil spring 3 and the helical direction is similarly succeeded and bent by bending the arch 6 of the protrusion 4 slantingly downward.

Figure 10:
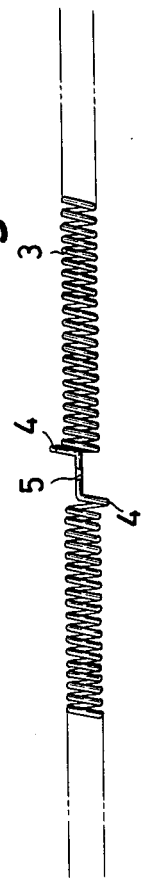
FIG. 10 is the plan view of the eighth embodiment, showing only the essential part.

In both FIG. 9 and FIG. 10, the stanchion shaped (⊓) protrusion 4 protrudes axially at approximately a right angle and is axially aligned with the spring 3 when viewed from above. It is furtherbent in a U-shape on the tip 5 of the protrusion 4.

Figure 11:
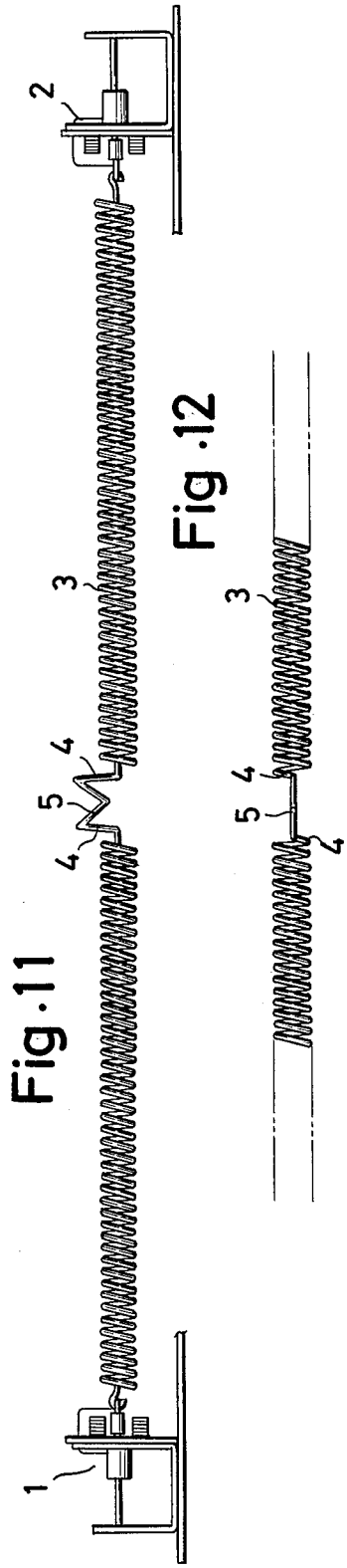
FIG. 11 is the front view of the ninth embodiment.
Figure 12:
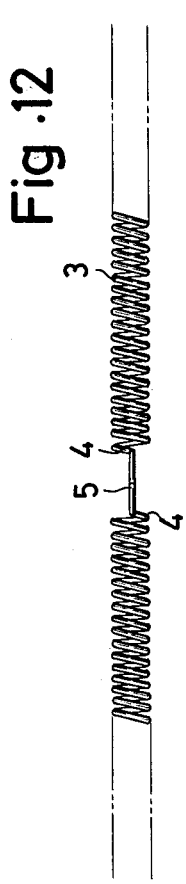
FIG. 12 is the plan view of the ninth embodiment, showing only the essential part.

In both FIG. 11 and FIG. 12, as above, the protrusion 4 in stanchion form is axially aligned with the spring 3 and is also bent in a V-form on the tip 5 thereof. Thus the protrusion 4 looks like a letter M' on the whole.

By bending the tip 5 of the protrusion 4, as well as by structuring the device as shown in FIG. 1 and FIG. 2, not only can the compressive movement induced by the repetition of the reflection at both ends of coil spring 3 be completely absorbed, but also, in this embodiment each frequency band in low, medium, and high pitch sound can also be functioned with approximately the same remnant time. Consequently, reverberation more nearly resembling natural reverberation is achieved.

Flutter sound can be prevented by the protrusion 4 provided at an optional position along the coil spring 3 as mentioned above, but it is necessary to have the portion of the protrusion 4 comparatively longer (approximately three times as long as the length of three coils of the coil spring 3. If the length of the protrusion 4 is made longer, the flutter sound can be completely prevented. However, the vibration moment in the helical direction to achieve reverberation will increase in proportion to this effect. The increase in a said vibration moment induces the resonance in the said portion, and the secondary problem of increasing only the remnant time of the low pitch sound from 80 Hz/Sec. to 700 Hz./Sec. is developed.

In the present embodiment, however, by bending the tip 5 of the protrusion 4, generation of a large vibration moment in the helical direction and resonance movement in the said portion can be prevented. Consequently, the increase of only the remnant time in low pitch sound is not developed, and the remnant time in each frequency band of low, medium, and high pitch sound is uniformly generated. When the tip the tip 5 of the protrusion 4 formed in succession will said protrusion is suppressed all the time in the direction of suppression because each base portion of the said protrusions 4 is pulled in two directions at both ends by the coil spring 3, wherein its action in the direction of the elongation is restricted, its elasticity becomes less than the other coiled portion. Thus, it is for this portion to function as the reflection point of vibration transmission in the helical direction and it is possible to attain the various retardation timed complex vibration phenomena. This prevents the emanation of metallic shrieky sounds as well as makes it possible to get just as excellent a frequency characteristic with a single line of coil spring 3 as is possible when many lines of coil spring were employed.

In FIGS. 13, 14, 15, and 16 the proteiform embodiments of the above said embodiment are shown.

In both FIG. 13 and FIG. 14, the arch shape protrusion 4, which is larger than the coil diameter of the coil spring 3 and has its helical direction succeeded in series, has its tip looped once in the same helical direction as the coil spring 3 forming the loop 7.

As mentioned above, the loop 7 can be made in plural numbers. If loop 7 is formed by looping, once, the tip of the protrusion 4 so that it intersects at approximately a right angle to the helical direction of the coil spring 3. By forming the loop in this way, the same action as shown in the embodiment of FIG. 7 or FI. 12 can be obtained, i.e. the remnant sound obtained in this way is closer to the natural remnant sound, and it is possible to obtain remnant sound closer to that heard in the concert hall.

What is claimed is:

1. An echo annexation device for use in an apparatus having a drive-transducer and a pickup-transducer, said device comprising:

a continuous helically coiled spring helically wound about a central axis and connected between said drive-transducer and said pickup-transducer, said coiled spring being comprised of a plurality of equal diameter helical first coil segments coaxially aligned with each other and said central axis through said spring; and at least one second coil segment between two of said first coil segments, said second coil segment being a helical loop with a diameter greater than the diameter of said first coil segments and wound in the same direction as said first coil segments about said central axis, said helical loop having a tip portion, and said tip portion being bent downwardly at an angle toward said central axis.

2. An echo annexation device for use in an apparatus having a drive-transducer and a pickup-transducer, said device comprising:

a continuous helically coiled spring helically wound about a central axis and connected between said drive-transducer and said pickup-transducer, said coiled spring being comprised of a plurality of equal diameter helical first coil segments coaxially aligned with each other and said central axis through said spring; and at least one second coil segment between two of said first coil segments, said second coil segment being a helical loop with a diameter greater than the diameter of said first coil segments and would in the same direction as said first coil segments about said central axis, said helical loop having a tip portion, and said tip portion having a loop therein.

3. An echo annexation device for use in an apparatus having a drive-transducer and a pickup-transducer, said device comprising:

a continuous helically coiled spring helically would about a central axis and connected between said drive-transducer and said pickup-transducer, said coiled spring being comprised of a plurality of equal diameter helical first coil segments coaxially aligned with each other and said central axis through said spring; and at least one second coil segment between two of said first coil segments, said second coil segment being a helical loop with a diameter greater than the diameter of said first coil segments and wound in the same direction as said first coil segments about said central axis, said helical loop having a tip portion, and said tip portion having a loop therein, the central axis of said tip loop being at a right angle to said central axis of said coiled spring.

4. An echo annexation device for use in an apparatus having a drive-transducer and a pickup-transducer, said device comprising:

a continuous helically coiled spring helically wound about a central axis and connected between said drive-transducer and said pickup-transducer, said coiled spring being comprised of a plurality of equal diameter helical first coil segments coaxially aligned with each other and said central axis through said spring; and at least one second coil segment between two of said first coil segments, said second coil segment being a helical loop with a diameter greater than the diameter of said first coil segments and wound in the same direction as said first coil segments about said central axis, said helical loop having a plurality of helical loops wound about a second central axis, said second central axis being parallel to said central axis through said first coil segment.

5. An echo annexation device for use in an apparatus having a drive-transducer and a pickup-transducer, said device comprising:

a continuous helically coiled spring helically wound about a central axis and connected between said drive-transducer and said pickup-transducer, said coiled spring being comprised of a plurality of equal diameter helical first coil segments coaxially aligned with each other and said central axis through said spring; and at least one second coil segment between two of said first coil segments, said second coil segment extending between said first coil segments in a line approximately parallel to said central axis of said coiled spring.

6. A device as claimed in claim 5, wherein said second coil segment has a U-shaped bent portion therein.

7. A device as claimed in claim 5, wherein said second coil segment has a V-shaped bent portion therein.

8. An echo annexation device for use in an apparatus having a drive-transducer and a pickup-transducer, said device comprising:

a continuous helically coiled spring helically wound about a central axis and connected between said drive-transducer and said pickup-transducer, said coiled spring being comprised of a plurality of equal diameter helical first coil segments coaxially aligned with each other and said central axis through said spring; and a plurality of second coil segments between pairs of said first coil segments along the length of said coiled spring.

9. A device as claimed in claim 8, wherein each of said second coil segments is a helical loop, wound in the same direction as said first coil segments about said central axis, each helical loop having a diameter greater than the diameter of each first coil segment.

10. A device as claimed in claim 8, wherein each of said second coil segments extends between said pairs of first coil segments in a line approximately parallel to said central axis of said coiled spring.

* * * * *